United States Patent [19]
Nepil

[11] Patent Number: 5,095,276
[45] Date of Patent: Mar. 10, 1992

[54] TRACTOR TRAILER LIGHT SYSTEM TEST CIRCUIT

[76] Inventor: James C. Nepil, 57 Red Neck Ave., Little Ferry, N.J. 07643

[21] Appl. No.: 637,679

[22] Filed: Jan. 7, 1991

[51] Int. Cl.⁵ .......................................... G01R 31/02
[52] U.S. Cl. ...................... 324/504; 324/503; 324/66
[58] Field of Search ............... 324/503, 504, 505, 508, 324/66, 539; 340/635

[56] References Cited

U.S. PATENT DOCUMENTS

| | | |
|---|---|---|
| 2,743,431 | 4/1956 | Wright . |
| 3,428,888 | 2/1969 | Nolte . |
| 3,646,438 | 2/1972 | Staff ................................ 324/503 |
| 3,663,939 | 5/1972 | Olsson ............................. 324/504 |
| 4,021,730 | 5/1977 | Brinegar . |
| 4,104,581 | 8/1978 | Arkosy . |
| 4,162,478 | 7/1979 | Huber . |
| 4,166,242 | 8/1979 | Spiteri . |
| 4,249,125 | 2/1981 | Carver . |
| 4,547,722 | 10/1985 | Sarlo ................................ 324/504 |
| 4,884,032 | 11/1989 | Lapensee ........................ 324/504 |

Primary Examiner—Kenneth A. Wieder
Assistant Examiner—Jose M. Solis
Attorney, Agent, or Firm—R. Martin Oliveras

[57] ABSTRACT

A tractor-trailer light system test circuit comprises: a first multi-pin plug; a plurality of circuit breakers; a second multi-pin plug; an audible buzzer; an ON-OFF push button switch; a first LED, a second LED, and a third LED; a plurality of resistors; a first resistor, a secon resistor, and a third resistor; a first test plug and a second test plug; and a first plurality of light emitting diodes, a second plurality of light emitting diodes, and a third plurality of light emitting diodes.

7 Claims, 8 Drawing Sheets

TRACTOR TRAILER LIGHT SYSTEM TEST CIRCUIT

FIELD OF THE INVENTION

This invention relates to a tractor-trailer light system test circuit and inn particular to such a circuit that determines short, open, and crossed circuit conditions.

DISCUSSION OF THE PRIOR ART

The prior art reveals several circuits for checking the condition of a tractor-trailer light circuit such as:

a. Wright U.S. Pat. No. 2,743,431 entitled "Condition Indicators For Lighting Systems Of Trucks And Trailers" discloses such an indicator comprising a driver's compartment unit, a plurality of leads, a signal light, signal light actuating means, and a flashing device;

b. Nolte U.S. Pat. No. 3,428,888 entitled "Electrical Circuit Tester For Tractor-Trailer Cable" discloses apparatus comprising a detachable plug, a socket connection, a portable current conducting container, a battery, at least one principal socket, a plurality of pin holes, a first series of auxiliary sockets, a plurality of test indicating lights, a plurality of auxiliary plugs, a plurality of flexible wires, and a ground connection;

c. Brinegar U.S. Pat. No. 4,021,730 entitled "Electrical Conductor And Short Circuit Locater" discloses apparatus comprising first and second test leads, fuse terminals, current limiting means, a clamp-on ammeter, pulse generating means, solid state switching means, adjustable frequency oscillator means, an astable multivibrator, a first transistor, a first diode, a first polarity conduction path, a second transistor, a second diode, and a second polarity conduction path;

d. Arkosy U.S. Pat. No. 4,104,581 entitled "Method Utilizing An Automatic Restorable Circuit Breaker For Locating Ground Faults In A Vehicle" discloses such a method comprising the steps of disconnecting the battery hot terminal, connecting an automatic restorable circuit breaker, selecting a protected circuit, moving an induction current measuring ammeter over the selected protected circuit, and locating the grounded fault;

e. Huber et al U.S. Pat. No. 4,162,478 entitled "Circuit Arrangement For Testing Operating And/Or Capacity Conditions In Automotive Vehicles" discloses such a circuit comprising a plurality of parallel circuits, a plurality of pilot lamps, a plurality of switching means, and a single test switch;

f. Spiteri U.S. Pat. No. 4,166,242 entitled "Tractor Cable Light Circuit" discloses a circuit checker comprising a socket, a plug, a common ground pin, a plurality of live pins, a printed circuit board, a common ground circuit, a plurality of indicating circuits, a lead, a plurality of light emitting diodes, a plurality of resistors, a connection pad, and a soldered connection;

g. Carver U.S. Pat. No. 4,249,125 entitled "Portable Device For Testing And/Or Temporarily Correcting Circuits In A Vehicle Electrical System" discloses such a device comprising a pair of releasable junction portions, a plurality of individual power circuits, a plurality of light circuits, a body member, a plurality of sockets, a plurality of prongs, a plurality of recesses, a plurality of visual electrical indicators, and a removable cover.

Objects of the present invention are therefore to provide:

a. a test circuit for indicating a fault, failure, defect, or malfunction in the light system of a tractor-trailer vehicle;

b. a test circuit for indicating short, open, or crossed circuit conditions in the light system of a tractor-trailer vehicle;

c. a test circuit for testing the light system of a tractor-trailer vehicle;

d. a test circuit for isolating desired circuit portions in the light system of a tractor-trailer vehicle.

SUMMARY OF THE PRESENT INVENTION

A summary and features of the present invention are that:

a. A tractor-trailer light system test circuit comprises: a first multi-pin plug; a plurality of circuit breakers; a second multi-pin plug; a first light emitting diode; a second light emitting diode; a third light emitting diode; a plurality of resistors; a first resistor; a second resistor; a third resistor; a first test plug; a second test plug; a first plurality of light emitting diodes; a second plurality of light emitting diodes; a third plurality of light emitting diodes; audible buzzer means; and ON-OFF switch means.

b. Such test circuit also comprises: a first junction for interconnecting such first multi-pin plug, such second multi-pin plug, and a second junction; a second junction for interconnecting such first junction, a third junction, and such audible buzzer; a third junction for interconnecting such third resistor, such second junction, a fourth junction, and such first test plug; a fourth junction for interconnecting such third junction, such first resistor, and such second resistor; a first plurality of junctions for interconnecting such second resistor and such third plurality of light emitting diodes; a second plurality of junctions for interconnecting such first resistor and such second plurality of light emitting diodes; a third plurality of junctions for interconnecting such plurality of circuit breakers, such first plurality of light emitting diodes, and a fourth plurality of junctions; a fourth plurality of junctions for interconnecting such third plurality of junctions, such second multi-pin plug, and such second plurality of light emitting diodes; a fifth plurality of junctions for interconnecting such plurality of circuit breakers, such plurality of resistors, and a sixth plurality of junctions; a sixth plurality of junctions for interconnecting such first multi-pin plug, such fifth plurality of junctions, and such third plurality of light emitting diodes; a fifth junction for interconnecting such second resistor, such third light emitting diode, and a sixth junction; a sixth junction for interconnecting such fifth junction, such second light emitting diode, and such first light emitting diode; a seventh junction for interconnecting such second test plug, such audible buzzer, and such ON-OFF switch; and an eighth junction for interconnecting such third light emitting diode, such second light emitting diode, such first light emitting diode, and such ON-OFF switch.

c. according to a first operational circuit configuration, the circuit pathway comprises: a first peripheral pin of such first multi-pin plug; such first resistor; two of such second plurality of light emitting diodes; two of such plurality of resistors; two of such first plurality of light emitting diodes; two of such plurality of circuit breakers; second and third peripheral pins of such first multi-pin plug; such second resistor; two of such third plurality of light emitting diodes; second and third peripheral pins of such second multi-pin plug; and a first peripheral pin of such second multi-pin plug.

d. according to a second operational circuit configuration, the circuit pathway comprises: a first peripheral pin of such first multi-pin plug; such first test plug; such second resistor; one of such third plurality of light emitting diodes; such audible buzzer; such ON-OFF switch; such second test plug; such first, second, and third light emitting diodes; one of such plurality of resistor means; one of such first plurality of light emitting diodes; one of such plurality of circuit breakers; such third resistor; a second peripheral pin of such second multi-pin plug; a first peripheral pin of such second multi-pin plug; and a second peripheral pin of such first multi-pin plug.

e. according to a third operational circuit configuration, the circuit pathway comprises: a first peripheral pin of such first multi-pin plug; such first resistor; one of such second plurality of light emitting diodes; one of such plurality of resistors; one of such first plurality of light emitting diodes; one of such plurality of circuit breakers; such second resistor; one of such third plurality of light emitting diodes; a second peripheral pin of such second multi-pin plug; a first peripheral pin of such second multi-pin plug; and a second peripheral pin of such first multi-pin plug.

f. according to a fourth operational circuit configuration, the pathway comprises: a first peripheral pin of such first multi-pin plug; such first resistor; two of such second plurality of light emitting diodes; two of such plurality of resistors; two of such first plurality of light emitting diodes; two of such plurality of circuit breakers; second and third peripheral pins of such first multi-pin plug; such second resistor; and two of such third plurality of light emitting diodes.

g. according to a fifth operational circuit configuration, the circuit pathway comprises: a first peripheral pin of such first multi-pin plug; such first test plug; such first resistor; one of such second plurality of light emitting diodes; one of such plurality of circuit breakers; such second resistor; one of such third plurality of light emitting diodes; such audible buzzer; such ON-OFF switch; such second test plug; such first, second, and third diodes; such third resistor; and a second peripheral pin of such first multi-pin plug.

h. according to a sixth operational circuit configuration, the circuit pathway comprises: a first peripheral pin of such first multi-pin plug; such first resistor; one of such second plurality of light emitting diodes; one of such plurality of circuit breakers; such second resistor; one of such third plurality of light emitting diodes; and a second peripheral pin of such first multi-pin plug.

Advantages of the present invention are therefore that:

a. the housing for such tractor-trailer light system test circuit is compact;

b. such test circuit is light;

c. such test circuit may be utilized in any make of tractor or trailer;

d. such test circuit is readily and easily connectable to a tractor-trailer light system.

BRIEF DESCRIPTION OF THE DRAWING

The above and other objects, features, and advantages of the present invention will be better appreciated from a reading of the following detailed description with reference to the drawing in which.

DETAILED DESCRIPTION OF THE DRAWING

Figure 1:
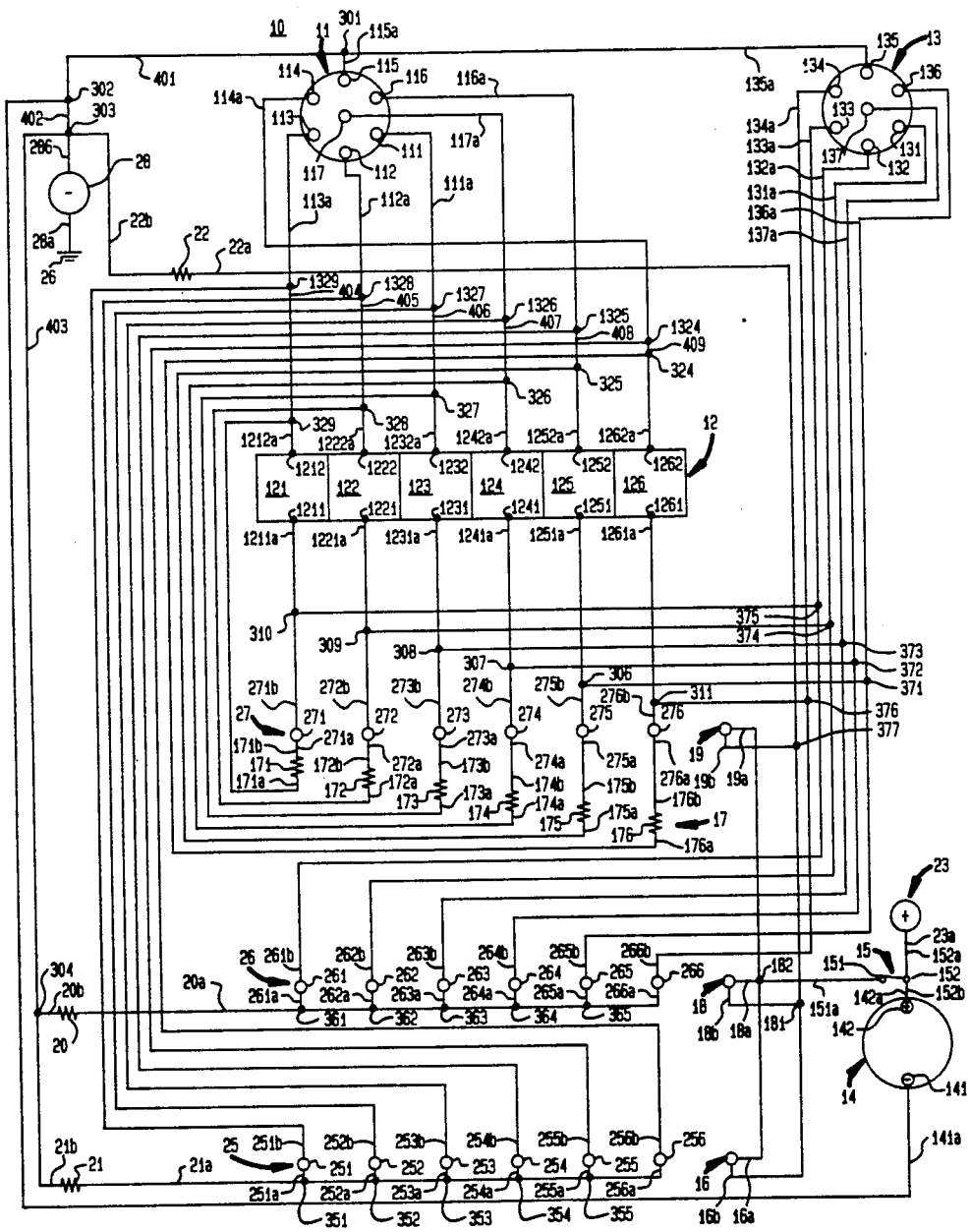
FIG. 1 is circuit diagram of a tractor-trailer light system test circuit according to the present invention.

FIG. 1 is a circuit diagram of tractor-trailer light system test circuit 10 according to the present invention. Test circuit 10 generally comprises: first multi-pin plug 11; a plurality of circuit breakers 12; second multi-pin plug 13; audible buzzer 14; ON-OFF switch 15; light emitting diodes 16, 18, and 19; a plurality of resistors 17; resistors 20, 21, and 22; test plug 23 and test plug 28; and a plurality of light emitting diodes 25, a plurality of light emitting diodes 26, and a plurality of light emitting diodes 27.

Plug 11 further comprises: peripheral pins 111, 112, 113, 114, 115, and 116; and central pin 117. Plurality of circuit breakers 12 further comprises individual circuit breakers 121, 122, 123, 124, 125, and 126. Plug 13 further comprises: peripheral pins 131, 132, 133, 134, 135, and 136; and central pin 137. Audible buzzer 14 further comprises terminals 141 and 142. ON-OFF switch 15 further comprises terminals 151 and 152. Plurality of resistors 17 further comprises individual resistors 171, 172, 173, 174, 175, and 176. Plurality of light emitting diodes 25 further comprises individual light emitting diodes 251, 252, 253, 254, 255, and 256. Plurality of light emitting diodes 26 further comprises individual light emitting diodes 261, 262, 263, 264, 265, and 266. Finally, plurality of light emitting diodes 27 further comprises individual light emitting diodes 271, 272, 273, 274, 275, and 276.

With respect to plug 11: leads 111a, 112a, 113a, 114a, 115a, 116a, and 117a are respectively connected to pins 111, 112, 113, 114, 115, 116 and 117. With respect to circuit breakers 121, 122, 123, 124, 125, and 126: leads 1211a, 1221a, 1231a, 1241a, 1251a, and 1261a are respectively connected to terminals 1211, 1221, 1231, 1241, 1251, and 1261; While leads 1212a, 1222a, 1232a, 1242a, 1252a, and 1262a are respectively connected to terminals 1212, 1222, 1232, 1242, 1252, and 1262. With respect to plug 13: leads 131a, 132a, 133a, 134a, 135a, 136a, and 137a are respectively connected to pins 131, 132, 133, 134, 135, 136, and 137. With respect to buzzer 14: leads 141a and 142a are respectively connected to terminals 141 and 142. With respect to switch 15: lead 151a is connected to terminal 151; while leads 152a and 152b are connected to terminal 152. With respect to light emitting diode 16: leads 16a and 16b are connected to the terminals thereof. With respect to resistors 171, 172, 173, 174, 175, and 176: leads 171a and 171b, 172a and 172b, 173a and 173b, 174a and 174b, 175a and 175b, and 176a and 176b are respectively connected to the terminals thereto. With respect to light emitting diode 18, leads 18a and 18b are connected to the terminals thereof. With respect to light emitting diode 19, leads 19a and 19b are connected to the terminals thereof. With respect to resistor 20, leads 20a and 20b are connected to the terminals thereof. With respect to resistor 21, leads 21a and 21b are connected to the terminals thereof. With respect to resistor 22, leads 22a and 22b are connected to the terminals thereof. With respect to test plug 23: lead 23a is connected to the terminal thereof. With respect to light emitting diodes 251, 252, 253, 254, 255, and 256: leads 251a and 251b, 252a and 252b, 253a and 253b, 254a and 254b, 255a and 255b, and 256a and 256b are respectively connected to the terminals thereof. With respect to light emitting diodes 261, 262, 263, 264, 265, and 266: leads 261a and 261b, 262a and 262b, 263a and 263b, 264a and 264b, 265a and 26b, and 266a and 266b are respectively connected to the terminals thereof. With respect to light emitting diodes 271, 272, 273, 274, 275, and 276: leads 271a and 271b, 272a and 272b, 273a and 273b, 274a and 274b, 275a and 275b, and 276a and 276b are respectively connected to the terminals thereof. Finally, with respect to test plug 28: leads 28a and 28b are connected to the terminals thereof.

According to the present invention, tractor-trailer light system test circuit 10 comprises: first multi-pin plug 11; plurality of circuit breakers 121-126; second multi-pin plug 13; first light emitting diode 16; second light emitting diode 18; third light emitting diode 19; plurality of resistors 171-176; first resistor 20; second resistor 21; third resistor 22; first test plug 26; second test plug 23; first plurality of light emitting diodes 171-176; second plurality of light emitting diodes 261-266; third plurality of light emitting diodes 251-256; audible buzzer 14; and ON-OFF switch 15.

Test circuit 10 also comprises: first junction 301 for interconnecting first multi-pin plug 11, second multi-pin plug 13, and second junction 302; second junction 302 for interconnecting first junction 301, third junction 303, and audible buzzer 14; third junction 303 for interconnecting third resistor 22, second junction 302, fourth junction 304, and first test plug 28; fourth junction 304 for interconnecting third junction 303, first resistor 20, and second resistor 21; first plurality of junctions 351-355 for interconnecting second resistor 21 and third plurality of light emitting diodes 251-256; second plurality of junctions 361-365 for interconnecting first resistor 20 and second plurality of light emitting diodes 261-266; third plurality of junctions 306-311 for interconnecting plurality of circuit breakers 121-126, first plurality of light emitting diodes 271-276, and fourth plurality of junctions 371-376; fourth plurality of junctions 371-376 for interconnecting third plurality of junctions 306-311, second multi-pin plug 13, and second plurality of light emitting diodes 261-266; fifth plurality of junctions 324-329 for interconnecting plurality of circuit breakers 121-126, plurality of resistors 171-176, and sixth plurality of junctions 1324-1329; sixth plurality of junctions 1324-1329 for interconnecting first multi-pin plug 11, sixth plurality of junctions 324-329, and third plurality of light emitting diodes 251-256; fifth junction 377 for interconnecting third resistor 22, third light emitting diode 19, and sixth junction 181; sixth junction 181 for interconnecting fifth junction 377, second light emitting diode 18, and first light emitting diode 16; seventh junction 152 for interconnecting second test plug 23, audible buzzer 14, and ON-OFF switch 15; and eighth junction 182 for interconnecting third light emitting diode 19, second light emitting diode 18, first light emitting diode 16, and ON-OFF switch 15.

Figure 2:
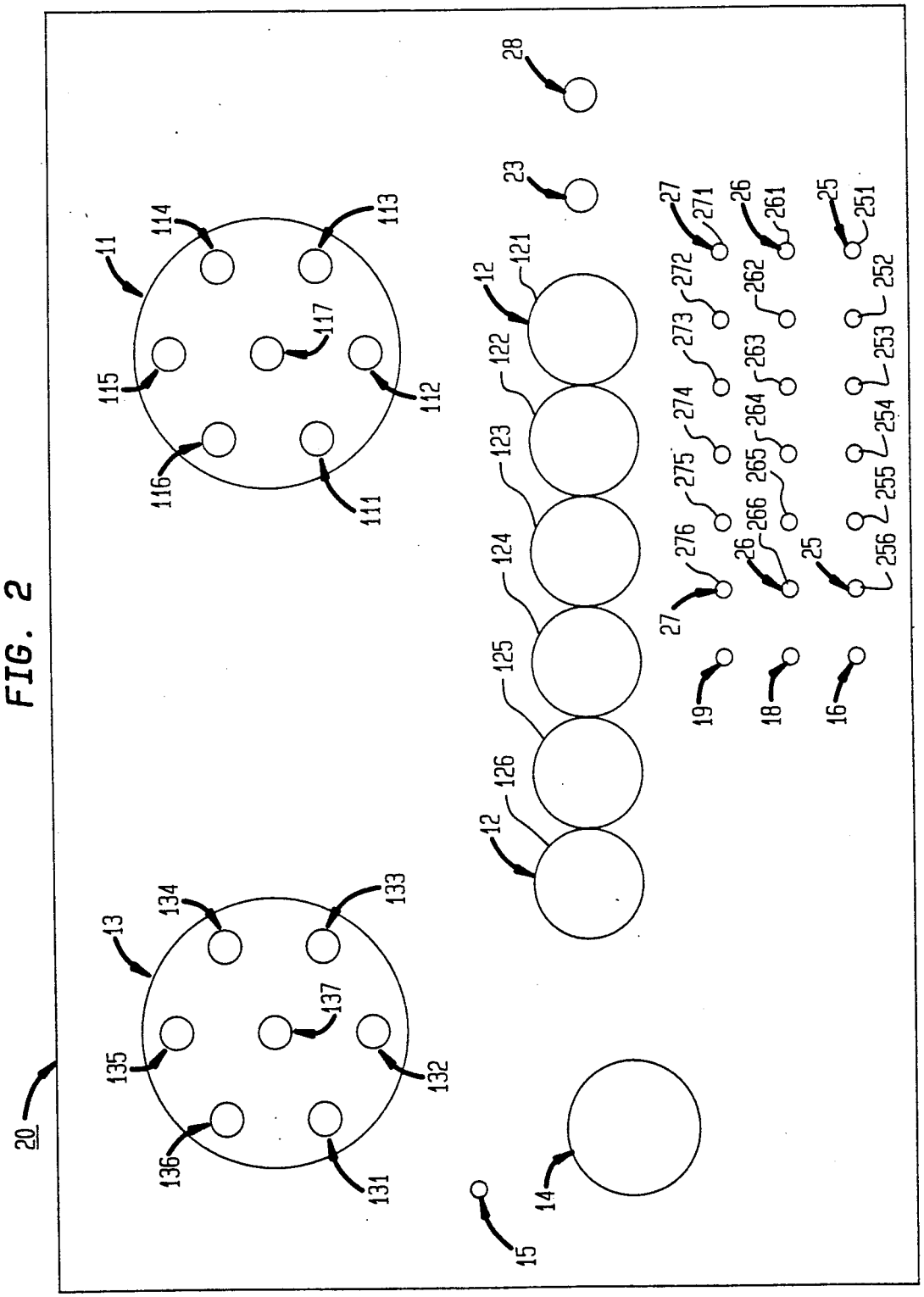
FIG. 2 is a diagram of the chassis containing such tractor-trailer light system test circuit according to the present invention.

FIG. 2 is a diagram of chassis 20 containing tractor-trailer light system test circuit 10 according to the present invention. FIG. 2 shows: first multi-pin plug 13 including pins 131-137; second multi-pin plug 11 including pins 111-117; ON-OFF button switch 15; audible buzzer 14; plurality of circuit breakers 121-126; second test plug 23; first test plug 28; third light emitting diode 19; first plurality of light emitting diodes 271-276; second light emitting diode 18; second plurality of light emitting diodes 261-266; first light emitting diode 16; and third plurality of light emitting diodes 251-266.

Figure 3:
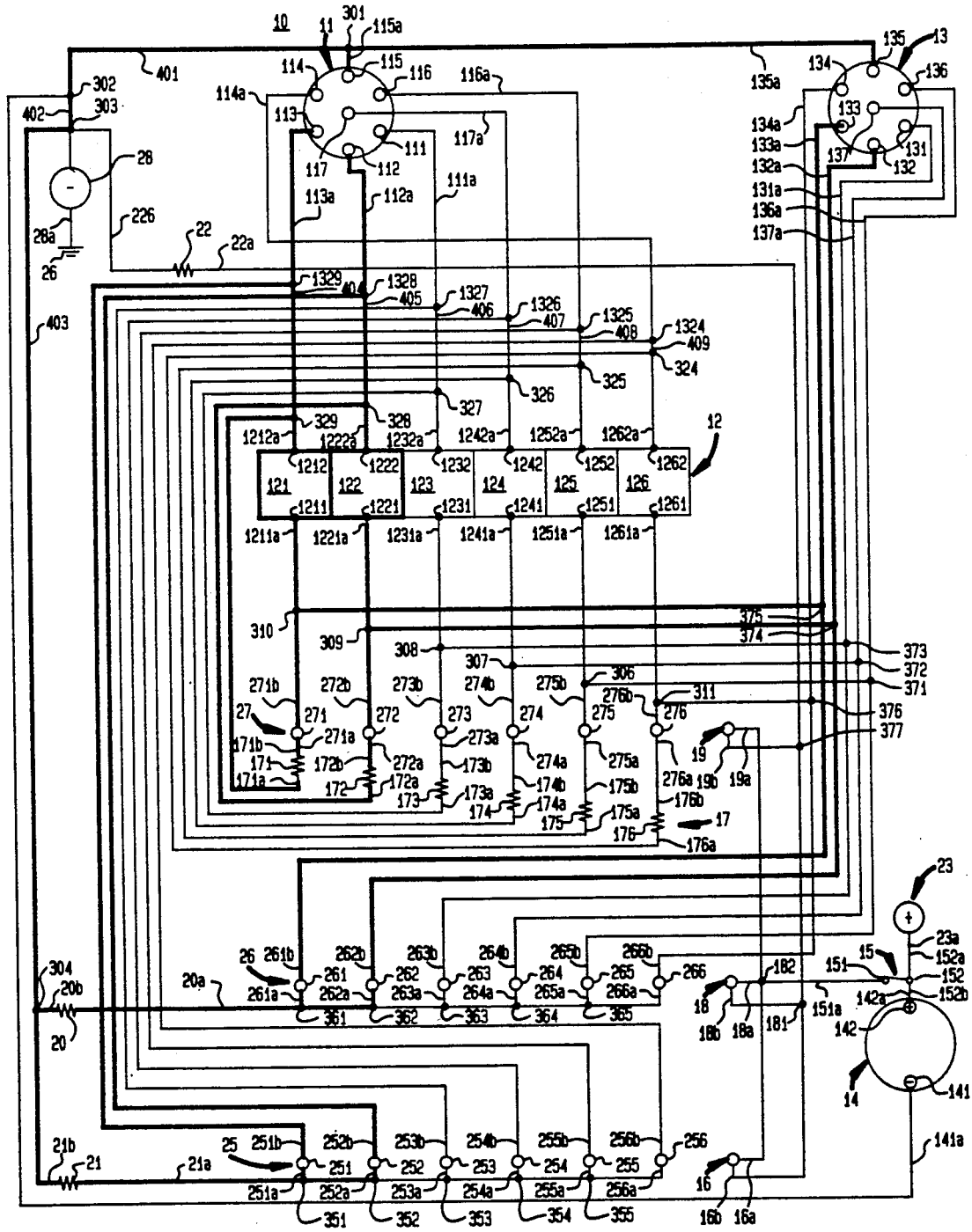
FIG. 3 is a first operational circuit configuration according to the present invention.

FIG. 3 is a first operational circuit configuration according to the present invention which indicates a crossed-circuit between the stop-light circuit and the left-turn signal circuit of the trailer. Such first circuit pathway comprises: peripheral pin 115; resistor 20; light emitting diodes 261 and 262; resistors 171 and 172; light emitting diodes 171 and 172; circuit breakers 121 and 122; peripheral pins 112 and 113; resistor 21; light emitting diodes 251 and 252; peripheral pins 132 and 133; and peripheral pin 135.

Figure 4:
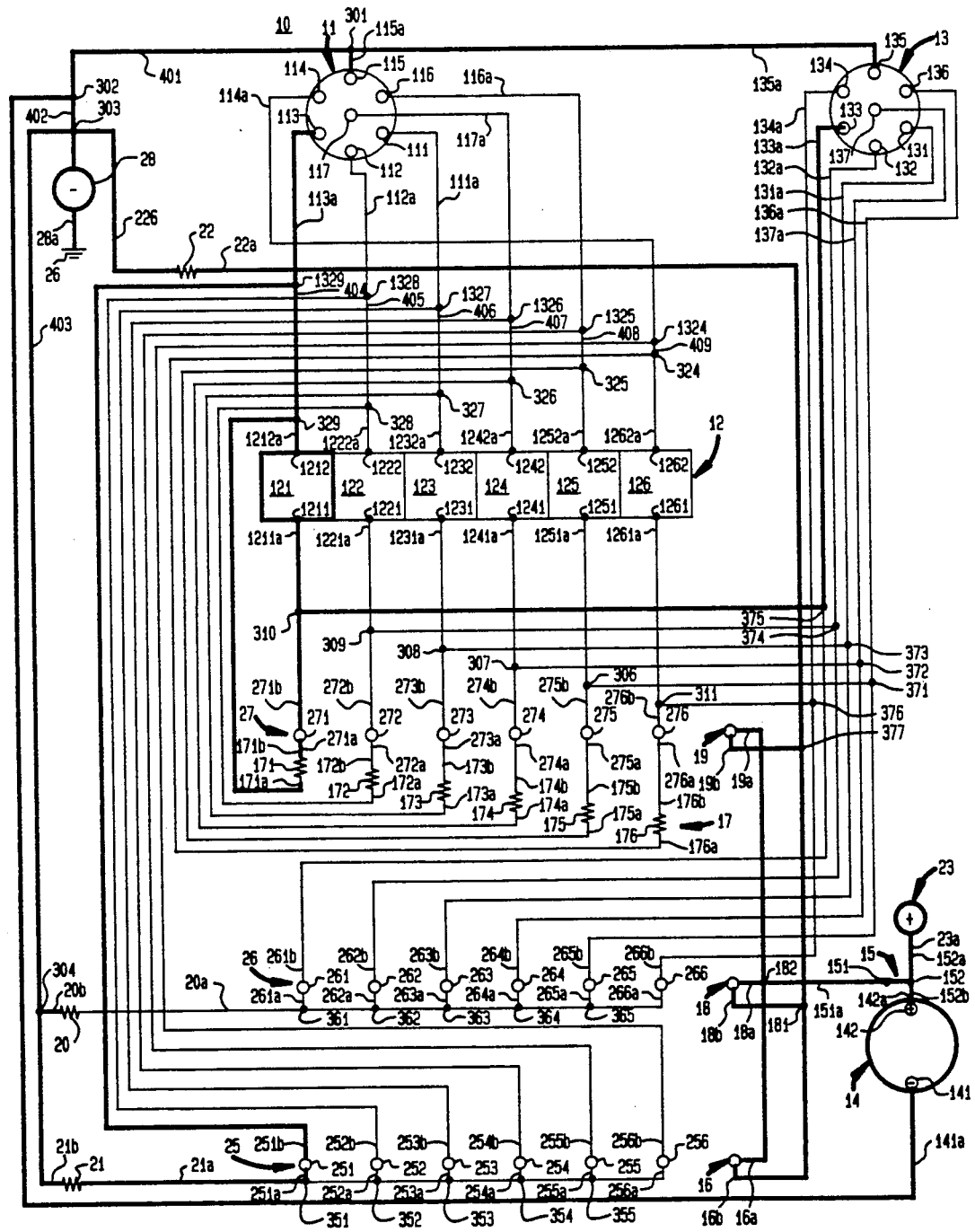
FIG. 4 is a second operational circuit configuration according to the present invention.

FIG. 4 is a second operational circuit configuration according to the present invention which indicates the left-turn signal circuit with a short-circuit to ground. In this case the tested circuit pathway is double tested with a test light, buzzer 14, light emitting diode 16, light emitting diode 18, and light emitting diode 19. The circuit pathway includes plug 23, plug 28, lead 26, lead 28a, lead 402, junction 302, lead 141a, lead 141, lead 142, lead 152b, lead 152a, switch 15, lead 151a, lead 181, lead 182, lead 18a, lead 18b, lead 22a, resistor 22a, lead 286, junction 303, and ground terminal 28. Such second circuit pathway comprises: peripheral pin 115; test plug 28; resistor 22; resistor 21; light emitting diode 251; audible buzzer 14; ON-OFF switch 15; test plug 23; light emitting diodes 16, 18, and 19; resistor 171; light emitting diode 271; circuit breaker 121; peripheral pin 133; peripheral pin 135; and peripheral pin 113.

Figure 5:
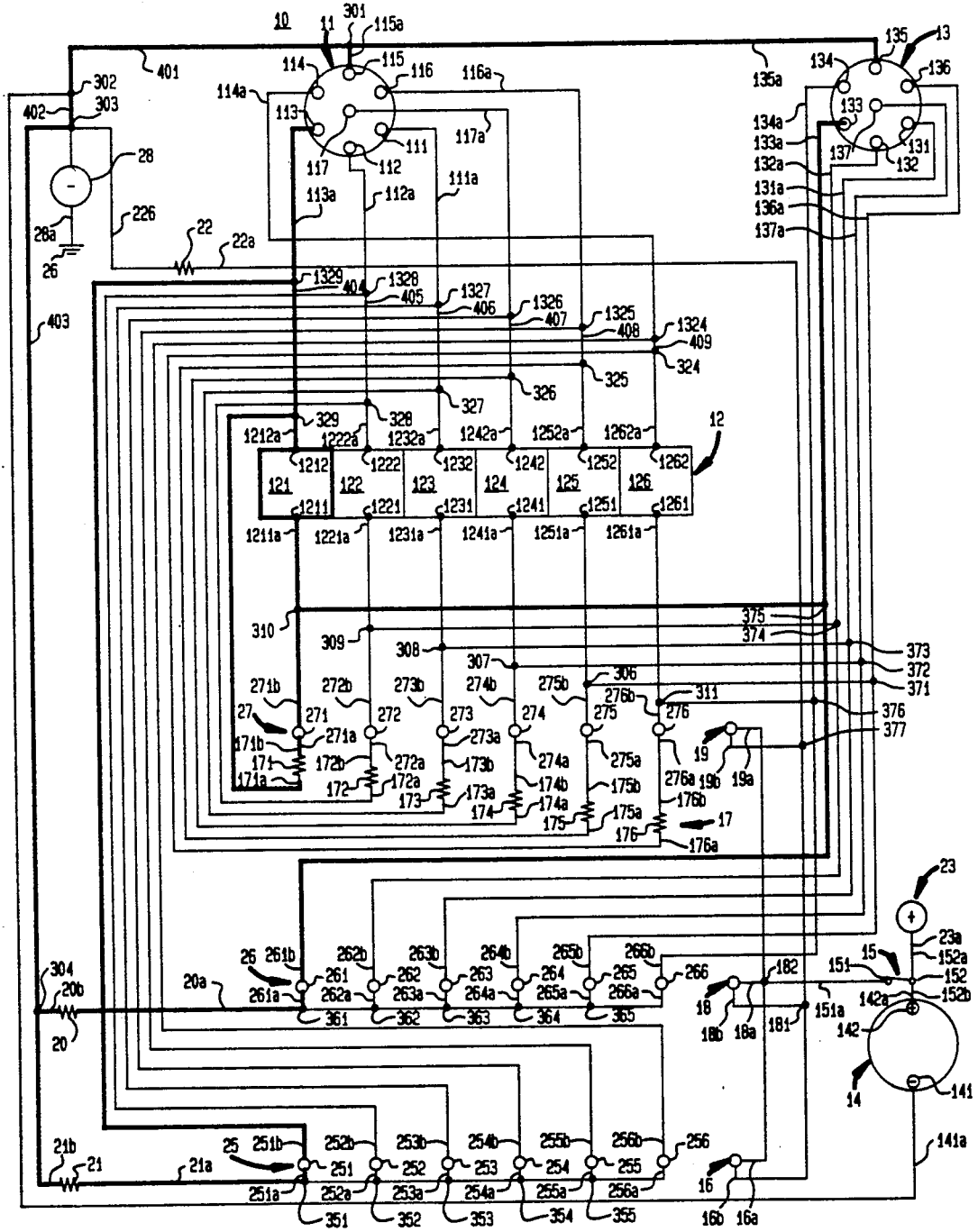
FIG. 5 is a third operational circuit configuration according to the present invention.

FIG. 5 is a third operational circuit configuration according to the present invention which indicates a left-turn signal circuit with a short-circuit to ground. Such third circuit pathway comprises: peripheral pin 115; resistor 20; light emitting diode 261; resistor 171; light emitting diode 271; circuit breaker 121; resistor 21; light emitting diode 251; peripheral pin 133; peripheral pin 135; and peripheral pin 113.

Figure 6:
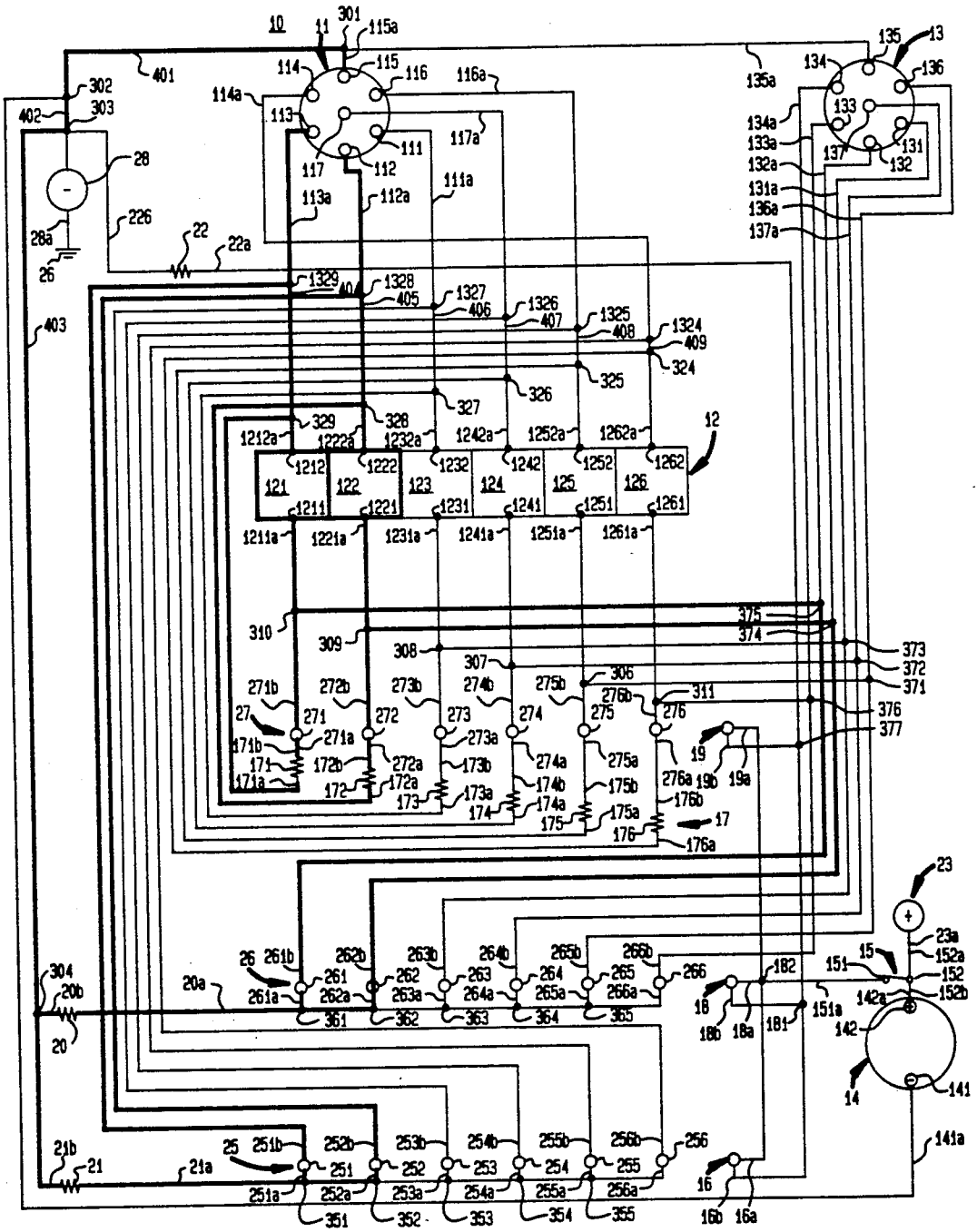
FIG. 6 is a fourth operational circuit configuration according to the present invention.

FIG. 6 is a fourth operational circuit configuration according to the present invention which indicates a crossed-circuit between two different light-system circuit pathways being the stop-light circuit and the left-turn signal circuit with two different short-circuits to ground. Such fourth circuit pathway comprises: peripheral pin 115; resistor 20; light emitting diodes 261 and 262; resistors 171 and 172; light emitting diodes 271 and 272; circuit breakers 121 and 122; peripheral pins 112 and 113; resistor 21; and light emitting diodes 251 and 251.

Figure 7:
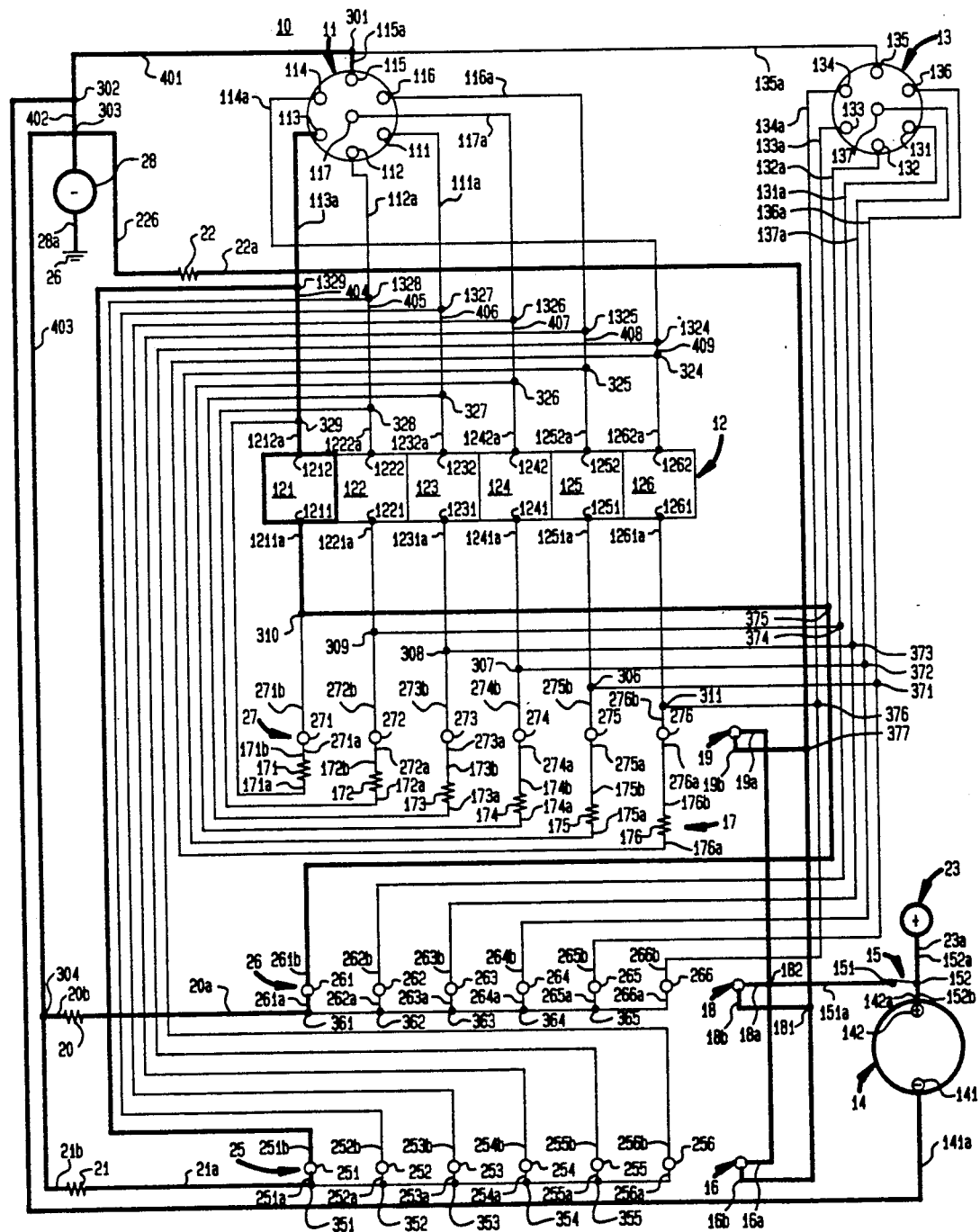
FIG. 7 is a fifth operational circuit configuration according to the present invention.

FIG. 7 is a fifth operational circuit configuration according to the present invention which indicates the left-turn signal circuit with no malfunction in the trailer light system and utilizing the test light and the buzzer. Such fifth circuit pathway comprises: peripheral pin 115; test plug 28; resistor 22; resistor 20; light emitting diode 261; circuit breaker 121; resistor 21; light emitting diode 251; buzzer 14; switch 15; test plug 23; light emitting diodes 16, 18, and 19; and peripheral pin 113.

Figure 8:
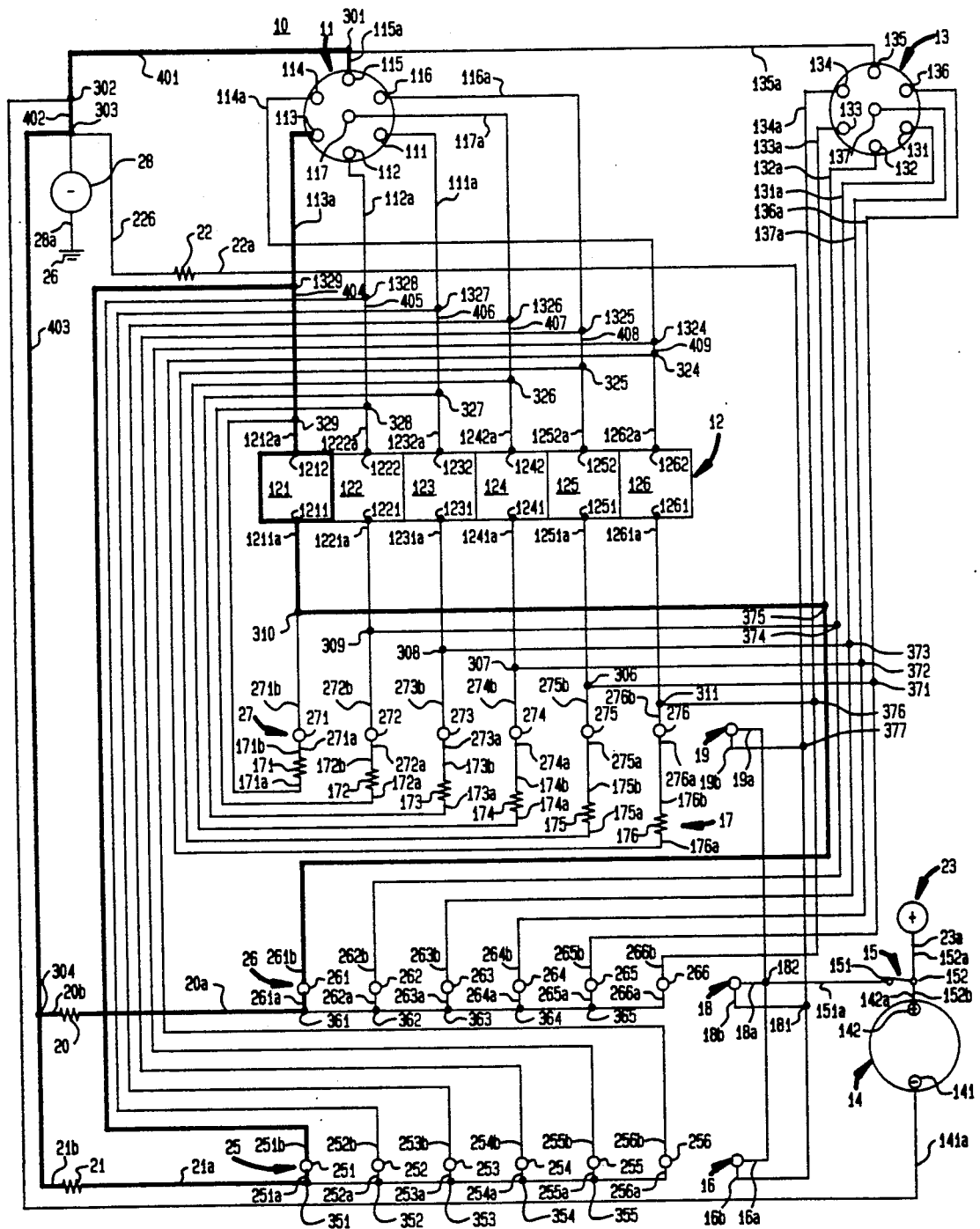
FIG. 8 is a sixth operational circuit configuration according to the present invention.

FIG. 8 is a sixth operational circuit configuration according to the present invention which indicates a left-turn signal circuit with no malfunction. Such sixth circuit pathway comprises: peripheral pin 115; resistor 20; light emitting diode 261; circuit breaker 121; resistor 21; light emitting diode 251; and peripheral pin 113.

The method for testing the associated light-system is the same for the circuit pathways shown in FIGS. 3, 4, 5, 6, 7, and 8. The tractor circuit being tested in plugged into plug 13 while the trailer circuit being tested is plugged into plug 11.

With respect to FIG. 3 there is shown a pathway for testing crossed-circuits in the stop-light circuit. The tractor brakes are applied to send a current through pin 132 to the testing system circuit pathways and back to the trailer light system circuit. The test circuit immediately picks up a crossed-circuit related to the left-turn signal circuit. This is indicated on the test circuit in which case the chassis of FIG. 2 would show light emitting diodes 25, 26, 252, and 262 in the ON state thereby indicating that two circuits are ON and not just the brake circuit; there would also be indicated the two particular circuits which are in the ON state. The wire colors aid in tracing the trailer light system circuit. This removes guesswork and saves repair time. After such repair is made, then light emitting diodes 25 and 26 go OFF thereby leaving only light emitting diodes 252 and 262 in the ON state. This indicates that such repair was made correctly thereby leaving only the stop-light circuit in proper operating condition.

The above example shows how to find a crossed-circuit between the left-turn signal circuit and the stop-light circuit. The particular circuit pathway includes: pin 135, lead 135a, trailer test pin 115 (which is ground), lead 115a, and junction 301. The pathway also includes: lead 401, junction 303, lead 304, lead 20b, and resistor 20. The pathway also includes: lead 20a, junction 361, lead 261a, light emitting diode 26, lead 261b, lead 133a, and plug 13. Light emitting diode is yellow to indicate the left-turn signal circuit which is associated with a yellow wire in the trailer light system. The circuit pathway also includes: lead 261b, junction 375, junction 310, and circuit breaker 121. The circuit pathway also includes: circuit breaker 121, junction 1212, lead 1212a, pin 113, and plug 11. The circuit pathway also includes: junction 329, resistor 171, and light emitting diode 27. Light emitting diode 27, which is red, would not go ON unless there is as short-circuit to ground. The circuit pathway also includes: junction 375, lead 133a, pin 133, and plug 13. The circuit pathway also includes: pin 113, lead 113a, junction 1329, lead 251b, and light emitting diode 25. Light emitting diode 25 is green and goes ON to indicate which circuit or circuits pathways are in use. Light emitting diode 25 would not go ON in the case of an open-circuit. The circuit pathway also includes: light emitting diode 25, junction 352, and light emitting diode 252. Light emitting diode 252 is green and functions in a way similar to light emitting diode 25. The circuit pathway also includes: lead 252b, junction 1328, lead 112a, pin 122, and plug 11. The circuit pathway also includes: junction 351, lead 21a, resistor 21, lead 21b, lead 403, lead 401, lead 402, junction 301, and pin 115. The circuit pathway also includes: lead 112a, circuit breaker 122, junction 1221, junction 309, junction 374, lead 132a, pin 132, and plug 13. The circuit pathway also includes: junction 309, lead 372b, lead 272 (which is red), lead 172b, resistor 172, lead 172a, junction 328, lead 405, and lead 112a. The circuit pathway also includes: plug 11, pin 115, lead 401, lead 402, lead 403, junction 304, lead 20b, resistor 20, and lead 20a. The circuit pathway also includes: junction 363 and light emitting diode 262 (which is yellow to indicate the tested circuit and its wire color). Finally, the circuit pathway includes: lead 262b, lead 132a, pin 132, and plug 13.

In summary, the testing procedure is the same for FIGS. 3, 4, 5, 6, 7, and 8. The tractor light system being tested is plugged into plug 13 while the trailer light system being tested in plugged into plug 11. In this case the red light emitting diode would go ON if there is a short-circuit to ground in any particular test. The yellow light emitting diode would go ON to indicate the particular circuit or circuits in operation and to indicate the color of the wire of each such circuit. These light emitting diodes will remain ON while the test is being performed. The green light emitting diode would go On except when there is an open-circuit or a short-circuit to ground thereby indicating that a problem exists in the particular circuit being tested. The subject test circuit tests each light system 21 different ways to indicate the actual circuit status.

While the principle according to the present invention has been described in terms of a specific illustrative embodiment, it will be apparent to those skilled in the art that many modifications are possible within the scope and spirit of such principle.

What is claimed is:

1. A tractor-trailer light system test circuit comprising:
   a. first multi-pin plug means;
   b. a plurality of circuit breaker means;
   c. second multi-pin plug means;
   d. first light emitting means;
   e. second light emitting means;
   f. third light emitting means;
   g. a plurality of resistor means;
   h. first resistor means;
   i. second resistor means;
   j. third resistor means;
   k. first test plug means;
   l. second test plug means;
   m. a first plurality of light emitting means;
   n. a second plurality of light emitting means;
   o. a third plurality of light emitting means;
   p. audible means; and
   q. ON-OFF switch means;
   said test circuit also comprising:
   a first junction for interconnecting said first multi-pin plug means, said second multi-pin plug means, and a second junction;
   a second junction for interconnecting said first junction, a third junction, and said audible means;
   a third junction for interconnecting said third resistor means, said second junction, a fourth junction, and said first test plug means;
   a fourth junction for interconnecting said third junction, said first resistor means, and said second resistor means;
   a first plurality of junctions for interconnecting said second resistor means and said third plurality of light emitting means;
   a second plurality of junctions for interconnecting said first resistor means and said second plurality of light emitting means;
   a third plurality of junctions for interconnecting said plurality of circuit breaker means, said first plurality of light emitting means, and a fourth plurality of junctions;

a fourth plurality of junctions for interconnecting said third plurality of junctions, said second multi-pin plug means, and said second plurality of light emitting means;

a fifth plurality of junctions for interconnecting said plurality of circuit breaker means, said plurality of resistor means, and a sixth plurality of junctions; a sixth plurality of junctions for interconnecting said first multi-pin plug means, said fifth plurality of junctions, and said third plurality of light emitting means;

a fifth junction for interconnecting said third resistor means, said third light emitting means, and a sixth junction;

a sixth junction for interconnecting said fifth junction, said second light emitting means, and said first light emitting means;

a seventh junction for interconnecting said second test plug means, said audible means, and said ON-OFF switch means; and an eighth junction for interconnecting said third light emitting means, said second light emitting means, said first light emitting means, and said ON-OFF switch means.

2. The test circuit of claim 1 wherein according to a first operational circuit configuration, the circuit pathway comprises: a first peripheral pin of said first multi-pin plug means; said first resistor means; two of said second plurality of light emitting means; two of said plurality of resistor means; two of said first plurality of light emitting means; two of said plurality of circuit breakers; second and third peripheral pins of said first multi-pin plug means; said second resistor means; two of said third plurality of light emitting means; second and third peripheral pins of said second multi-pin plug means; and a first peripheral pin of said second multi-pin plug means.

3. The test circuit of claim 1 wherein according to a second operational circuit configuration, the circuit pathway comprises: a first peripheral pin of said first multi-pin plug means; said first test plug means; said second resistor means; one of said third plurality of light emitting means; said audible means; said ON-OFF switch means; said second test plug means; said first, second, and third light emitting means; one of said plurality of resistor means; one of said first plurality of light emitting means; one of said plurality of circuit breaker means; said third resistor means; first and second peripheral pins of said second multi-pin plug means; and a second peripheral pin of said first multi-pin plug means.

4. The test circuit of claim 1 wherein according to a third operational circuit configuration, the circuit pathway comprises: a first pin of said first multi-pin plug means; said first resistor means; one of said second plurality of light emitting mean; one of said plurality of resistor means; one of said first plurality of light emitting means; one of said plurality of circuit breaker means; said second resistor means; one of said third plurality of light emitting means; a second peripheral pin of said second multi-pin plug means; a first peripheral pin of said second multi-pin plug means; and a second peripheral pin of said first multi-pin plug means.

5. The test circuit of claim 1 wherein according to a fourth operational circuit configuration, the circuit pathway comprises: a first peripheral pin of said first multi-pin plug means; said first resistor means; two of said first plurality of light emitting means; two of said plurality of resistor means; two of said first plurality of light emitting means; two of said plurality of circuit breaker means; second and third peripheral pins of said first multi-pin plug means; said second resistor means; and two of said third plurality of light emitting means.

6. The test circuit of claim 1 wherein according to a fifth operational circuit configuration, the circuit pathway comprises: a first peripheral pin of said first multi-pin plug means; said first test plug means; said first resistor means; one of said second plurality of light emitting means; one of said plurality of circuit breaker means; said second resistor means; one of said third plurality of light emitting means; said audible means; said ON-OFF switch means; said second test plug means; said first, second, and third light emitting means; said third resistor means; and a second peripheral pin of said first multi-pin plug means.

7. The test circuit of claim 1 wherein according to a sixth operational circuit configuration, the circuit pathway comprises: a first peripheral pin of said first multi-pin plug means; said first resistor means; one of said second plurality of light emitting means; one of said plurality of circuit breaker means; said second resistor means; one of said third plurality of light emitting mean; and a second peripheral pin of said first multi-pin plug means.

* * * * *